US012734577B2

(12) United States Patent
Hara et al.

(10) Patent No.: US 12,734,577 B2
(45) Date of Patent: Sep. 15, 2026

(54) METAL-Si BASED POWDER, METHOD FOR PRODUCING SAME, METAL-Si BASED SINTERED BODY, SPUTTERING TARGET, AND METAL-Si BASED THIN FILM MANUFACTURING METHOD

(71) Applicant: TOSOH CORPORATION, Shunan (JP)

(72) Inventors: Hiroyuki Hara, Ayase (JP); Masami Mesuda, Ayase (JP)

(73) Assignee: TOSOH CORPORATION, Shunan (JP)

( * ) Notice: Subject to any disclaimer, the term of this patent is extended or adjusted under 35 U.S.C. 154(b) by 541 days.

(21) Appl. No.: 17/999,596

(22) PCT Filed: May 24, 2021

(86) PCT No.: PCT/JP2021/019673
§ 371 (c)(1),
(2) Date: Nov. 22, 2022

(87) PCT Pub. No.: WO2021/241522
PCT Pub. Date: Dec. 2, 2021

(65) Prior Publication Data
US 2023/0220538 A1 Jul. 13, 2023

(30) Foreign Application Priority Data
May 26, 2020 (JP) ................................ 2020-091321

(51) Int. Cl.
*B22F 1/00* (2022.01)
*B22F 1/05* (2022.01)
(Continued)

(52) U.S. Cl.
CPC .................. *B22F 1/00* (2013.01); *B22F 1/05* (2022.01); *B22F 1/12* (2022.01); *C23C 14/14* (2013.01);
(Continued)

(58) Field of Classification Search
CPC ...... B22F 1/00; B22F 1/05; B22F 1/12; B22F 9/08; B22F 2301/20; B22F 2302/45;
(Continued)

(56) References Cited

U.S. PATENT DOCUMENTS

2007/0189916 A1 8/2007 Zhang
2021/0025049 A1* 1/2021 Dasai ................. C23C 14/3414

FOREIGN PATENT DOCUMENTS

EP 4 129 954 A1 2/2023
JP 8-20863 A 1/1996
JP 10-110264 A 4/1998
JP 2002-173765 A 6/2002
JP 2003-167324 A 6/2003
JP 2013-502368 A 1/2013
(Continued)

OTHER PUBLICATIONS

Machine Translation JP 2017-152316 (Year: 2017).*
(Continued)

*Primary Examiner* — Rodney G McDonald
(74) *Attorney, Agent, or Firm* — Oblon, McClelland, Maier & Neustadt, L.L.P.

(57) ABSTRACT

A metal-Si based powder contains a metal-Si based particle including a plurality of crystal phase grains. The crystal phase grains include a crystal phase containing a compound of a metal and Si. The crystal phase grains have an average grain size of, for example, 20 μm or less. The metal-Si based particle has an average particle size of, for example, 5 to 100 μm.

13 Claims, 5 Drawing Sheets

(51) Int. Cl.
*B22F 1/12* (2022.01)
*C23C 14/14* (2006.01)
*C23C 14/34* (2006.01)

(52) U.S. Cl.
CPC ...... *C23C 14/3414* (2013.01); *B22F 2301/20* (2013.01); *B22F 2302/45* (2013.01); *B22F 2304/10* (2013.01)

(58) Field of Classification Search
CPC ..... B22F 2304/10; C22C 1/1042; C22C 1/04; C22C 1/05; C22C 28/00; C22C 27/06; C04B 2235/5436; C04B 2235/77; C04B 35/58092; C04B 35/62218; C04B 35/645; C04B 35/6455; C04B 35/58; C04B 2235/428; C04B 2235/6567; C04B 2235/786; C04B 2235/80; C01B 33/06
USPC .......................... 204/298.12, 298.13; 75/252
See application file for complete search history.

(56) References Cited

FOREIGN PATENT DOCUMENTS

| | | | | |
|---|---|---|---|---|
| JP | 2016-72192 | A | | 5/2016 |
| JP | 2017-82314 | A | | 5/2017 |
| JP | 2017152316 | A | * | 8/2017 |
| WO | WO 99/19102 | A1 | | 4/1999 |
| WO | WO 2011/022058 | A1 | | 2/2011 |
| WO | WO 2019/187329 | A1 | * | 10/2019 |
| WO | WO 2020/105591 | A1 | | 5/2020 |

OTHER PUBLICATIONS

Extended European Search Report issued on May 24, 2024 in European Patent Application No. 21812235.6, 10 pages.
International Search Report issued on Jun. 29, 2021 in PCT/JP2021/019673, 3 pages.
International Preliminary Report on Patentability and Written Opinion issued on Dec. 8, 2022 in PCT/JP2021/019673, 8 pages.

* cited by examiner

METAL-Si BASED POWDER, METHOD FOR PRODUCING SAME, METAL-Si BASED SINTERED BODY, SPUTTERING TARGET, AND METAL-Si BASED THIN FILM MANUFACTURING METHOD

CROSS-REFERENCE TO RELATED APPLICATIONS

The present application is a 35 U.S.C. § 371 national stage patent application of International patent application PCT/JP2021/019673, filed on May 24, 2021, which is based on and claims the benefits of priority to Japanese Application No. 2020-091321, filed on May 26, 2020. The entire contents of these applications are incorporated herein by reference.

TECHNICAL FIELD

The present invention relates to a metal-Si based powder, a method for producing the same, a metal-Si based sintered body, a sputtering target, and a metal-Si based thin film manufacturing method.

BACKGROUND ART

In recent years, silicides such as $CrSi_2$ have been used as thin films in many technical fields such as semiconductors and solar cells because they have high resistivity (unit: Ω·cm) that is unlikely to change with temperature change. In the industrial production of thin films, a sputtering method using a sputtering target is often used. However, since compositions containing a silicide such as $CrSi_2$ generally have low strength, cracking may occur in processing into a sputtering target and discharging during film formation. For this reason, it is known that compositions containing a silicide are difficult to use as sputtering targets.

PTL 1 below discloses a method for producing, by a thermal spraying method, a sputtering target containing a Cr phase, a Si phase, and a silicide compound in a target material for the purpose of improving strength of the sputtering target.

PTL 2 below discloses a method for producing, by a melting method, a composition having a eutectic aggregate that contains Si and a silicide.

PTL 3 and PTL 4 below also disclose sputtering targets containing Si and a silicide.

CITATION LIST

Patent Literature

PTL 1: Japanese Unexamined Patent Publication No. 2017-82314

PTL 2: Japanese Unexamined Patent Publication No. 2013-502368

PTL 3: Japanese Unexamined Patent Publication No. 2002-173765

PTL 4: Japanese Unexamined Patent Publication No. 2003-167324

SUMMARY OF INVENTION

Technical Problem

However, the composition or the sputtering targets of PTL 1 to PTL 4 above have room for improvement in achieving both a low amount of oxygen and high strength.

An object of the present invention is to provide a metal-Si based powder that enables the production of a sintered body having a low amount of oxygen and high strength, a method for producing the same, a metal-Si based sintered body, a sputtering target, and a metal-Si based thin film manufacturing method.

Solution to Problem

As a result of extensive studies on silicide-based powders, the inventors of the present invention have found that a plurality of crystal phase grains can be included in a metal-Si based particle contained in a metal-Si based powder by employing, for example, a gas atomization method and that a sintered body obtained by firing the metal-Si based powder has a low amount of oxygen and high strength, and completed the present invention.

Specifically, a first aspect of the present invention is as follows.

A first aspect of the present invention is a metal-Si based powder containing a metal-Si based particle including a plurality of crystal phase grains, in which the crystal phase grains include a crystal phase containing a compound of a metal and Si.

According to the metal-Si based powder, a sintered body having a low amount of oxygen and high strength can be produced.

In the metal-Si based powder, the crystal phase grains preferably have an average grain size of 20 μm or less.

In this case, a sintered body having higher strength can be produced compared with the case where the average grain size of the crystal phase grains exceeds 20 μm.

In the metal-Si based powder, the metal-Si based particle preferably has an average particle size of 5 to 100 μm.

In this case, compared with the case where the metal-Si based particle has an average particle size of less than 5 μm, the metal-Si based particle has a small specific surface area, and the amount of oxygen in the sintered body can be made small. On the other hand, compared with the case where the metal-Si based particle has an average particle size of more than 100 μm, the rapid cooling effect by the gas atomization method increases, coarsening of the crystal phase grains is unlikely to occur, and thus the strength of the sintered body can be increased.

In the metal-Si based powder, the metal-Si based particle preferably further includes a substance that fills a gap between the plurality of crystal phase grains, and the substance is preferably constituted by a crystal phase.

In this case, the substance suppresses the separation of the plurality of crystal phase grains to further improve the strength of the metal-Si based powder.

In the metal-Si based powder, the metal-Si based particle preferably includes two types of crystal phases.

In this case, compared with the case where the metal-Si based particle is constituted by a single crystal phase, the grain growth of the crystal phase grains is suppressed, and the crystal phase grains become fine grains. Thus, the metal-Si based powder has higher strength.

In the metal-Si based powder, the two types of crystal phases are preferably constituted by a first crystal phase composed of a silicide and a second crystal phase composed of Si.

In this case, since the crystal phase grains are constituted by two types of different crystal phases, the grain growth of the crystal phase grains is suppressed, and the crystal phase grains become fine grains. Therefore, the metal-Si based powder has higher strength.

In the metal-Si based powder, a content of the first crystal phase is preferably higher than a content of the second crystal phase.

In this case, compared with the case where the content of the first crystal phase is equal to or lower than the content of the second crystal phase, the proportion of crystal phase grains having high strength is high, and thus the metal-Si based powder has higher strength.

In the metal-Si based powder, the metal is preferably Cr.

In this case, the metal-Si based powder enables the production of a thin film having a resistivity that is high and unlikely to change with temperature change.

The metal-Si based powder preferably contains oxygen in an amount of 0.5% by weight or less.

In this case, it is possible to suppress the generation of particles in manufacturing of a film (thin film) using a sputtering target obtained by using a sintered body of the metal-Si based powder and to improve the yield of a film product.

In the metal-Si based powder, a relative density of an untamped density to a true density is preferably 50% or more.

In this case, the amount of shrinkage during firing of the metal-Si based powder is reduced compared with the case where the relative density of the untamped density to the true density is less than 50%, and thus a sintered body can be produced in a near-net-shape. In addition, the usefulness of the metal-Si based powder as a powder for lamination shaping can also be enhanced.

A second aspect of the present invention is a method for producing the metal-Si based powder described above, the method including a step of melting a mixture of a metal and Si by heating to form a melt, and a step of ejecting a gas to the melt.

According to the production method, it is possible to produce a metal-Si based powder that enables the production of a sintered body having a low amount of oxygen and high strength.

A third aspect of the present invention is a metal-Si based sintered body obtained by firing the metal-Si based powder described above.

The metal-Si based sintered body can have a low amount of oxygen and high strength.

The metal-Si based sintered body preferably includes a sintered grain having an average grain size of 40 μm or less.

In this case, the strength of the sintered body increases sharply compared with the case where the average grain size of the sintered grain is more than 40 μm.

The metal-Si based sintered body preferably contains oxygen in an amount of 0.5% by weight or less and preferably has a flexural strength of 100 MPa or more.

In this case, it is possible to suppress the generation of particles when a film (thin film) is manufactured using a sputtering target obtained by firing a sintered body of the metal-Si based powder and to improve the yield of a product having the film (film product). In addition, when the sintered body has high strength, cracking is unlikely to occur also during grinding of the sintered body and in a bonding step of joining the sintered body to a base or the like. Accordingly, the yield of the film product is increased to improve productivity of the film product. Furthermore, even when a high power is applied to the sintered body during sputtering, the problem of cracking is unlikely to occur.

A fourth aspect of the present invention is a sputtering target including the metal-Si based sintered body described above.

The sputtering target can have a low amount of oxygen and high strength. Therefore, the sputtering target is unlikely to crack even when the output of an apparatus for performing sputtering is high and enables productivity of a thin film to be increased in the case of manufacturing the thin film. In addition, since the sputtering target has a low amount of oxygen, it is possible to suppress the generation of particles caused by abnormal electrical discharge during sputtering.

A fifth aspect of the present invention is a thin film manufacturing method including a step of performing sputtering using the sputtering target described above to form a thin film on a surface of a base.

In the thin film manufacturing method, even when the output of an apparatus for performing sputtering is high, the sputtering target is unlikely to crack, and thus, in the case of manufacturing a thin film, productivity of the thin film can be increased. In addition, since the sputtering target has a low amount of oxygen, it is possible to suppress the generation of particles caused by abnormal electrical discharge during sputtering.

The aspects of the present invention may be as follows.

(1) A metal-Si based powder in which two or more crystal phase grains having a size of 1 to 20 μm are included in one powder, and an average particle size is 5 to 100 μm.

(2) The metal-Si based powder according to (1), in which the metal is Cr (chromium).

(3) The metal-Si based powder according to (1) or (2), in which an amount of oxygen is 0.5% by weight or less.

(4) The metal-Si based powder according to any one of (1) to (3), in which a relative density of an untamped density of the powder is 50% or more.

(5) A method for producing the metal-Si based powder according to any one of (1) to (4), the method including mixing a metal flake and a silicon (Si) flake, melting the mixture by heating, and spraying a high-pressure gas to the melt that is dripped.

(6) A metal-Si based sintered body formed from the powder according to any one of (1) to (4).

(7) The metal-Si based sintered body according to (6), having an average grain size of 40 μm or less, containing oxygen in an amount of 0.5% by weight or less, and having a flexural strength of 100 MPa or more.

(8) The metal-Si based sintered body according to (6) or (7), in which the metal is Cr (chromium).

(9) A sputtering target composed of the metal-Si based sintered body according to any one of (6) to (8).

(10) A thin film manufacturing method including performing sputtering using the sputtering target according to (9).

Advantageous Effects of Invention

According to the present invention, there are provided a metal-Si based powder that enables the production of a sintered body having a low amount of oxygen and high strength, a method for producing the same, a metal-Si based sintered body, a sputtering target, and a metal-Si based thin film manufacturing method.

DESCRIPTION OF EMBODIMENTS

The present invention will be described in detail below.

<Metal-Si Based Powder>

Figure 1:
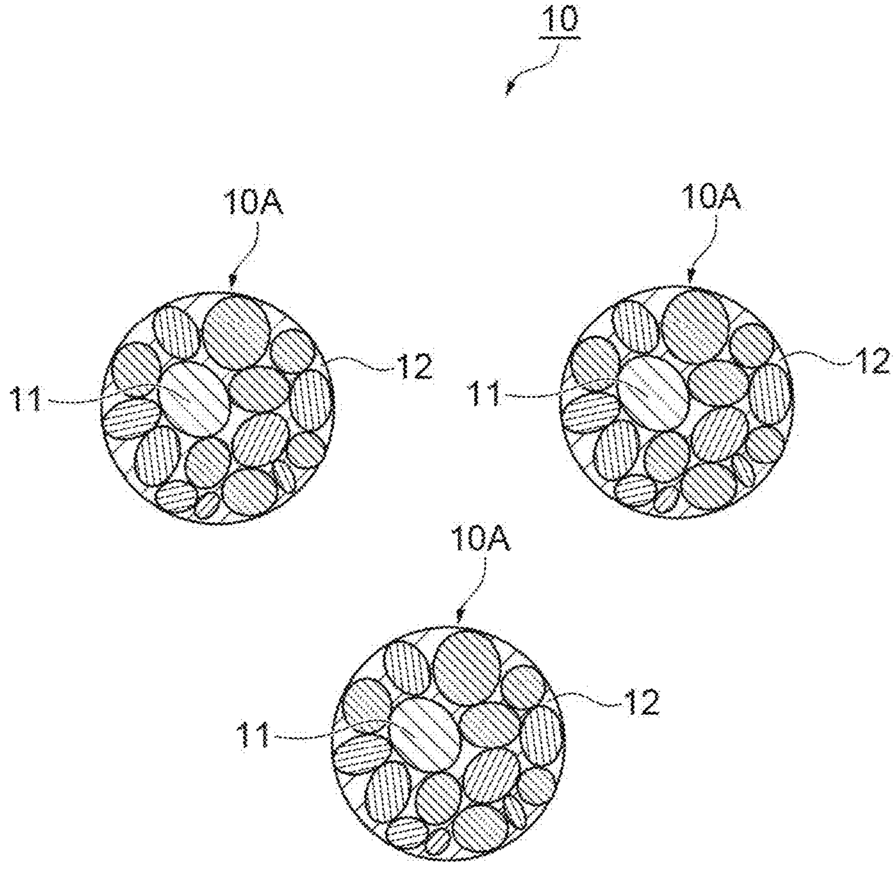
FIG. 1 is a sectional view that schematically illustrates an example of a metal-Si based powder according to the first aspect of the present invention.

First, a metal-Si based powder according to the first aspect of the present invention will be described with reference to FIG. 1. FIG. 1 is a sectional view that schematically illustrates an example of a metal-Si based powder according to the first aspect of the present invention. As illustrated in FIG. 1, a metal-Si based powder 10 according to the first aspect of the present invention contains metal-Si based particles 10A each including a plurality of crystal phase grains 11, in which the crystal phase grains 11 include a crystal phase containing a compound of a metal and Si.

According to the metal-Si based powder 10, a sintered body having a low amount of oxygen and high strength can be produced.

Although the reasons behind the above effect are unclear, the inventors of the present invention presume that the above effect is obtained for the following reasons. Specifically, since a plurality of crystal phase grains 11 are included in each of the metal-Si based particles 10A, the specific surface area is decreased, and the amount of oxygen adsorbed by the crystal phase grains 11 (amount of adsorbed oxygen) can be reduced. Thus, the metal-Si based particles 10A enable the amount of oxygen in a sintered body to be reduced. Furthermore, since a plurality of crystal phase grains 11 are included in each of the metal-Si based particles 10A, the crystal phase grains 11 are fine grains. Accordingly, when a stress is applied to the metal-Si based particles 10A, the stress is dispersed to the plurality of crystal phase grains 11, and thus a sintered body having high strength can be produced.

The metal-Si based powder 10 may be constituted by a single metal-Si based particle 10A alone or constituted by an aggregate of metal-Si based particles 10A.

The number of crystal phase grains 11 in the metal-Si based particle 10A is a plural number and is preferably 10 or more, more preferably 40 or more, and particularly preferably 100 or more. However, the number of crystal phase grains 11 in the metal-Si based particle 10A is preferably 500 or less. In this case, the crystal phase grains 11 have less surface irregularities as an aggregate thereof, and the amount of adsorbed oxygen can be further reduced. Herein, the crystal phase grains 11 include a crystal phase. Whether a crystal phase grain 11 includes a crystal phase can be checked by an electron back scatter diffraction (EBSD) method. Specifically, a section of the metal-Si based powder 10 (a surface exposed by cutting the metal-Si based powder 10) is tilted by 70° in a scanning electron microscope, a crystal phase grain 11 in the section is irradiated with an electron beam to obtain a diffraction pattern from the crystal phase grain 11, and the presence or absence of a crystal phase can be checked on the basis of an image of the diffraction pattern.

An average grain size of the crystal phase grains 11 is not particularly limited but is preferably 20 μm or less, more preferably 10 μm or less, and particularly preferably 5 μm or less.

When the average grain size of the crystal phase grains 11 is 20 μm or less, a sintered body having higher strength can be produced compared with the case where the average grain size of the crystal phase grains 11 exceeds 20 μm. The average grain size of the crystal phase grains 11 is preferably 1 μm or more from the viewpoint of achieving higher strength of the sintered body.

An average particle size of the metal-Si based particles 10A is not particularly limited as long as it is larger than the average grain size of the crystal phase grains 11, and is preferably 5 to 100 μm. In this case, compared with the case where the average particle size is smaller than 5 μm, the metal-Si based particles 10A have a smaller specific surface area, and the amount of oxygen in the sintered body can be made small. On the other hand, compared with the case where the average particle size is larger than 100 μm, the rapid cooling effect by the gas atomization method increases, and coarsening of the crystal phase grains 11 is unlikely to occur, and thus the strength of the sintered body can be increased. The average particle size of the metal-Si based particles 10A is more preferably 10 to 70 μm, and still more preferably 15 to 40 μm.

The metal-Si based particles 10A may each be constituted by a plurality of crystal phase grains 11 alone. Alternatively, as illustrated in FIG. 1, the metal-Si based particles 10A may further include a substance 12 that fills gaps between the plurality of crystal phase grains 11. In this case, the substance 12 is constituted by a crystal phase. When the metal-Si based particles 10A further include the substance 12, the substance 12 suppresses the separation of the plurality of crystal phase grains 11 to further improve the strength of the metal-Si based powder 10.

The metal-Si based particles 10A in the metal-Si based powder 10 can have different microstructures depending on the number of crystal phases. In the case of a single-phase powder having a single crystal phase, only the crystal phase grains 11 composed of the crystal phase gather to form a particle (single metal-Si based particle 10A). In the case of a two-phase powder having two crystal phases, although a crystal phase having a higher proportion forms crystal phase grains 11, a crystal phase having a lower proportion does not form crystal phase grains 11 but fills gaps between the crystal phase grains 11 and is present in the substance 12. The substance 12 is constituted by two types of crystal phases and is finer than the crystal phase grains 11. The substance 12 may have, for example, a layer structure. In this case, the crystal phase grains 11 and the substance 12 having a layer structure gather together to form a particle (metal-Si based particle 10A).

The metal-Si based particles 10A may include two types of crystal phases or may be constituted by a single crystal phase, but preferably include two types of crystal phases. In this case, compared with the case where the metal-Si based particles 10A are constituted by a single crystal phase, the grain growth of the crystal phase grains is suppressed, and the crystal phase grains become fine grains. Thus, the metal-Si based powder 10 has higher strength.

When the metal-Si based particles 10A include two types of crystal phases, the two types of crystal phases are preferably constituted by a first crystal phase composed of a silicide and a second crystal phase composed of Si. In this case, since the crystal phase grains are constituted by two types of different crystal phases (crystal structures), the grain growth of the crystal phase grains is suppressed, and a fine microstructure is obtained. Therefore, the metal-Si based powder 10 has higher strength.

The content of the first crystal phase may be higher than the content of the second crystal phase or may be equal to or lower than the content of the second crystal phase, but is preferably higher than the content of the second crystal phase. In this case, compared with the case where the content of the first crystal phase is equal to or lower than the content of the second crystal phase, the proportion of crystal phase grains having high strength is high, and thus the metal-Si based powder 10 has higher strength.

The content of the first crystal phase in the metal-Si based particles 10A is not particularly limited but is preferably 30% by weight or more, more preferably 40% by weight or more, and particularly preferably 50% by weight or more. In this case, compared with the case where the content of the first crystal phase in the metal-Si based particles 10A is less than 30% by weight, the proportion of the crystal phase grains having high strength is high, and thus the metal-Si based powder 10 has higher strength. However, the content of the first crystal phase in the metal-Si based particles 10A is preferably 95% by weight or less, and more preferably 90% by weight or less.

Examples of the metal in the compound of a metal and Si included in the crystal phase grains 11 include chromium (Cr), molybdenum (Mo), tungsten (W), barium (Ba), calcium (Ca), magnesium (Mg), strontium (Sr), iron (Fe), titanium (Ti), tantalum (Ta), and cobalt (Co). Of these, for example, chromium (Cr), molybdenum (Mo), or tungsten (W) is preferred as the metal, and a particularly preferred metal is chromium (Cr). In this case, the metal-Si based powder 10 enables the production of a thin film having a resistivity that is high and unlikely to change with temperature change.

The amount of oxygen in the metal-Si based powder 10 is preferably 0.5% by weight or less, more preferably 0.1% by weight or less, still more preferably 0.05% by weight or less, and particularly preferably 0.03% by weight or less. When the amount of oxygen in the metal-Si based powder 10 is 0.5% by weight or less, it is possible to suppress the generation of particles in manufacturing of a film (thin film) using a sputtering target obtained by using a sintered body of the metal-Si based powder 10 and to improve the yield of a film product.

A relative density of an untamped density to a true density of the metal-Si based powder 10 is not particularly limited but is preferably 50% or more. In this case, the amount of shrinkage during firing of the metal-Si based powder 10 is reduced compared with the case where the relative density of the untamped density to the true density is less than 50%, and thus a sintered body can be produced in a near-net-shape. In addition, the usefulness of the metal-Si based powder 10 as a powder for lamination shaping can also be enhanced. The relative density of the untamped density to the true density is more preferably 55% or more, and still more preferably 60% or more.

A total amount of metal impurities in the metal-Si based powder 10 is preferably 300 mass ppm or less, and particularly preferably 200 mass ppm or less. The "metal impurities" as used herein refer to metals that are other than the metal constituting the metal-Si based powder 10 and that have a concentration of 1,000 mass ppm or less.

In particular, when the metal constituting the metal-Si based powder 10 is a metal other than Fe, Mn, Mg, Ca, Sr, and Ba, a total amount of Fe and Mn is preferably 100 mass ppm or less, and particularly preferably 50 mass ppm or less. Compared with the case where the total amount of Fe and Mn exceeds 100 mass ppm, the metal-Si based powder 10 enables the production of a thin film having a resistivity that is high and unlikely to change with temperature change.

When the metal constituting the metal-Si based powder 10 is a metal other than Fe, Mn, Mg, Ca, Sr, and Ba, a total amount of Mg, Ca, Sr, and Ba is preferably 3 mass ppm or less, and particularly preferably 2 mass ppm or less. Compared with the case where the total amount of Mg, Ca, Sr, and Ba exceeds 3 mass ppm, the metal-Si based powder 10 enables the production of a thin film having a resistivity that is high and unlikely to change with temperature change.

<Method for Producing Metal-Si Based Powder>

Next, a method for producing a metal-Si based powder according to the second aspect of the present invention will be described.

The method for producing a metal-Si based powder according to the present invention includes a step of melting a mixture of a metal and silicon (Si) serving as raw materials by heating to form a melt, and a step of ejecting a gas to the melt.

The purity of each of the metal and silicon (Si) serving as the raw materials is not particularly limited, but is preferably 99.9% or more, and more preferably 99.99% or more. When the purity is 99.9% or more, the metal-Si based powder 10 is less likely to become the cause of exaggerated grain growth in a firing step of firing the metal-Si based powder 10 to form a sintered body or the source of generation of particles during film formation, compared with the case where the purity is less than 99.9%. The amount of oxygen in the raw materials is preferably small. When the amount of oxygen in the raw materials is small, the amount of oxygen is small in a sputtering target that is finally obtained, and the metal-Si based powder 10 is less likely to become the cause of generation of particles.

The shape of each of the metal and silicon is not particularly limited, but is preferably a flake shape. In this case, the raw materials have a small specific surface area, and the amount of oxygen in the metal-Si based powder and sintered body to be obtained can be further reduced. The mixture can be obtained by mixing the metal and silicon.

In the step of ejecting a gas to the melt, the melt may be dripped or may not be dripped.

In the step of ejecting a gas to the melt, the "ejecting" is also referred to as "spraying".

As the above method for producing a metal-Si based powder, a gas atomization method is preferably employed.

The gas atomization method is a technique of producing a powder by mixing raw materials, melting the mixture by heating to form a melt, and rapidly cooling particles produced by ejecting or spraying a gas such as a high-pressure gas to the melt that is dripped.

In particular, the metal-Si based powder 10 produced by the gas atomization method is preferably a powder having an average particle size (50% particle size) of 5 to 100 μm, more preferably 10 to 70 μm, and particularly preferably 15 to 40 μm.

A feature of the powder obtained by the gas atomization method is that metal-Si based particles contained in the powder have fine crystal phase grains therein. Since the crystal phase grains have a small surface area and are fine grains, a sintered body obtained by firing the powder can have a low amount of oxygen and high strength. On the other hand, even in the case of a fine powder mixture that is not a powder containing metal-Si based particles having crystal phase grains therein, a sintered body having high strength can be produced; however, the amount of oxygen in the sintered body is large. Even in the case of a coarse powder mixture that is not a powder containing metal-Si based particles having crystal phase grains therein, a sintered body having a low amount of oxygen can be obtained; however, the strength is low because of large particle sizes of coarse powders.

The heating temperature under the conditions for melting by heating is preferably higher than a melting temperature, and the difference (ΔT) between the heating temperature and the melting temperature is preferably 50° C. to 300° C. AT is more preferably 100° C. to 250° C. Herein, the melting temperature refers to a temperature at which a raw material powder melts. If ΔT is small, of the two crystal phases, a crystal phase having a higher melting point precipitates previously, and it is difficult to make the powder fine. On the other hand, if ΔT is large, after gas atomization, powder particles are sintered and adhere to a wall surface, resulting in a decrease in the recovery percentage of the powder.

An inert gas such as argon (Ar), nitrogen ($N_2$), or helium (He) can be used as the gas to be ejected or sprayed.

The gas pressure is preferably 1 MPa or more, more preferably 4 MPa or more, and particularly preferably 7 MPa or more. When the pressure of the gas is 1 MPa or more, the rapid cooling effect is increased. The pressure of the gas is preferably 10 MPa or less. In this case, it is possible to suppress an increase in the size of an apparatus for producing the metal-Si based powder or degradation of productivity of the metal-Si based powder.

In the gas atomization method, both a crucible method and an electrode method can be employed. In the case of employing the crucible method, a crucible is used. Regarding the material of the crucible, a crucible made of any of, for example, carbon, alumina, magnesia, silicon nitride, zirconia, and boron nitride can be used. Furthermore, a crucible produced by coating a body made of carbon, alumina, magnesia, or zirconia with boron nitride, silicon carbide, or the like can also be used as the crucible.

The powder after gas atomization is preferably kept in vacuum or in an inert atmosphere such as nitrogen or argon. In this case, compared with the case where the powder is placed in air, oxidation is unlikely to occur from the surface, and the amount of oxygen in the powder can be reduced.

<Metal-Si Based Sintered Body>

Figure 2:
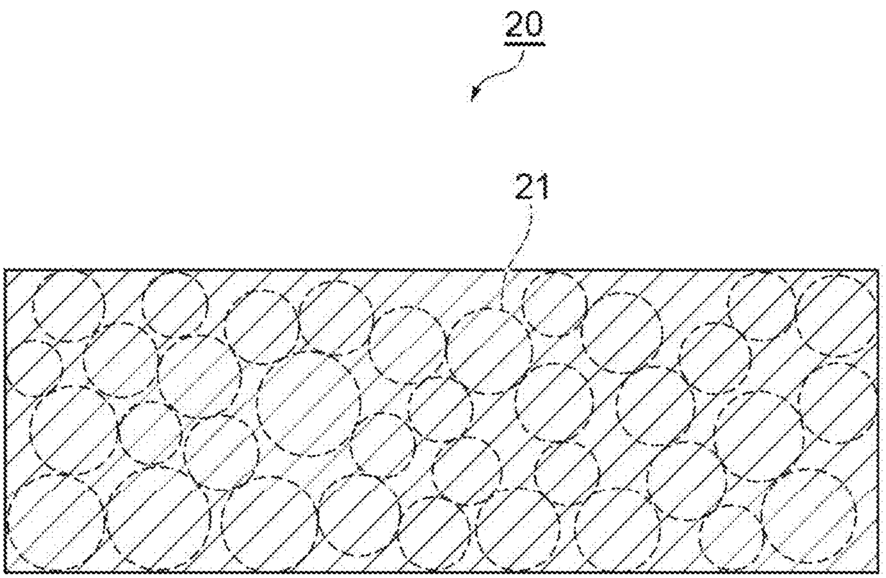
FIG. 2 is a sectional view illustrating a metal-Si based sintered body according to the third aspect of the present invention.

Next, the metal-Si based sintered body according to the third aspect of the present invention will be described with reference to FIG. 2. FIG. 2 is a sectional view illustrating a metal-Si based sintered body according to the third aspect of the present invention.

As illustrated in FIG. 2, a metal-Si based sintered body 20 according to the third aspect of the present invention is a sintered body obtained by sintering the metal-Si based powder 10 and includes sintered grains 21.

The metal-Si based sintered body 20 can have a low amount of oxygen and high strength.

An average grain size of the sintered grains 21 included in the metal-Si based sintered body 20 is not particularly limited but is preferably 40 μm or less. In this case, the strength of the metal-Si based sintered body 20 increases sharply compared with the case where the average grain size of the sintered grains 21 is more than 40 μm. In order to stably increase the strength of the metal-Si based sintered body 20, the average grain size is more preferably 20 μm or less, and particularly preferably 10 μm or less. The average grain size of the sintered grains 21 is preferably 1 μm or more. When the sintered grains 21 have an average grain size of 1 μm or more, pulverization treatment or the like is unnecessary, and impurities such as Fe and oxygen are less likely to be mixed.

From the viewpoint of suppressing the generation of particles when a film (thin film) is manufactured using a sputtering target obtained by firing a sintered body of the metal-Si based powder 10 to improve the yield of a film product, the amount of oxygen in the metal-Si based sintered body 20 is preferably 0.5% by weight or less, more preferably 0.1% by weight or less, still more preferably 0.05% by weight or less, and particularly preferably 0.03% by weight or less.

The flexural strength of the metal-Si based sintered body 20 is not particularly limited but is preferably 100 MPa or more, more preferably 100 to 500 MPa, still more preferably 150 to 500 MPa, and particularly preferably 200 to 500 MPa. When the sintered body 20 has high strength, cracking is unlikely to occur also during grinding of the sintered body 20 and in a bonding step of joining the sintered body 20 to a base or the like. Accordingly, the yield of a product having the film (film product) is increased to improve productivity of the film product. Furthermore, even when a high power is applied to the sintered body 20 during sputtering, the problem of cracking is unlikely to occur.

As the metal-Si based sintered body 20, a single-phase sintered body and a two-phase sintered body are present depending on the composition, and a two-phase sintered body is preferred in order to form a fine crystal phase in the grains (sintered grains 21).

When the metal-Si based sintered body 20 is a two-phase sintered body, both crystal phase grains 11 and a two-phase substance 12 are present. For example, in the case of the composition of 42% by weight of chromium (Cr) and 58% by weight of silicon (Si), the crystal phases are constituted by a $CrSi_2$ phase and a Si phase, the crystal phase grains 11 are composed of the $CrSi_2$ phase, and the substance 12 (two-phase) is composed of the $CrSi_2$ phase and the Si phase. The higher the cooling rate, the finer the crystal phase grains 11 and the two-phase substance 12. As the crystal phase grains 11 and the two-phase substance 12 become fine, the sintered density increases at low temperature, and thus the process margin is increased in the production. Accordingly, productivity of the metal-Si based sintered body 20 is improved.

Examples of the metal of the metal-Si based sintered body 20 include chromium (Cr), molybdenum (Mo), tungsten (W), barium (Ba), calcium (Ca), magnesium (Mg), strontium (Sr), iron (Fe), titanium (Ti), tantalum (Ta), and cobalt (Co). Of these, for example, chromium (Cr), molybdenum (Mo), or tungsten (W) is preferred, and chromium (Cr) is particularly preferred.

The metal-Si based sintered body 20 can be produced by, for example, firing the metal-Si based powder 10 while applying a pressure.

The firing is performed using, for example, a pressure firing furnace such as a hot-press furnace. In this case, compared with the case where a pressureless furnace is used, the diffusion coefficient of silicon is high, and thus the density of the sintered body 20 is easily increased.

The hot-press pressure during firing is preferably 50 MPa or less. In this case, compared with the case where the hot-press pressure during firing exceeds 50 MPa, a hot-press die that can be pressurized is easily prepared. In the case of producing a large sintered body, the hot-press pressure is preferably 5 to 50 MPa, more preferably 5 to 20 MPa, and particularly preferably 5 to 10 MPa.

The firing temperature is preferably 1,100° C. to 1,800° C. In this case, compared with the case where the firing temperature is lower than 1,100° C., the density of the sintered body 20 sufficiently increases, and compared with the case where the firing temperature exceeds 1,800° C., melting of the sintered body 20 can be prevented regardless of the hot-press pressure.

The temperature decrease rate after firing is not particularly limited and can be appropriately determined in consideration of, for example, the volume of the sintering furnace, the size and shape of the sintered body, and the ease of cracking of the sintered body.

The holding time during firing is preferably one to five hours. Compared with the case where the holding time during firing is shorter than one hour, temperature variation is unlikely to be generated in the furnace and the hot-press die, and a homogeneous microstructure is easily obtained. Compared with the case where the holding time is longer than five hours, productivity is further improved.

The atmosphere during firing is not particularly limited, and a vacuum or an inert atmosphere such as argon is preferred.

The metal-Si based sintered body 20 can be processed into various shapes. A plate-shaped metal-Si based sintered body 20 can be obtained by, for example, performing grinding using a machining device such as a surface grinder, a cylindrical grinder, a lathe, a cutter, or a machining center.

<Sputtering Target>

Next, a sputtering target according to the fourth aspect of the present invention will be described.

The sputtering target according to the fourth aspect of the present invention includes the metal-Si based sintered body 20. When the sputtering target is constituted by the metal-Si based sintered body 20, the metal-Si based sintered body 20 illustrated in FIG. 2 also functions as the sputtering target.

The sputtering target can have a low amount of oxygen and high strength. Therefore, the sputtering target is unlikely to crack even when the output of an apparatus for performing sputtering is high and enables productivity of a thin film to be increased in the case of manufacturing the thin film. In addition, since the sputtering target has a low amount of oxygen, it is possible to suppress the generation of particles caused by abnormal electrical discharge during sputtering.

The sputtering target may be optionally joined (bonded), with a bonding material such as indium solder, to a backing plate or backing tube made of oxygen-free copper, titanium, or the like.

<Thin Film Manufacturing Method>

Figure 3:
FIG. 3 is a sectional view illustrating a thin-film formed body having a thin film formed by the thin film forming method according to the fifth aspect of the present invention.
Figure 3:
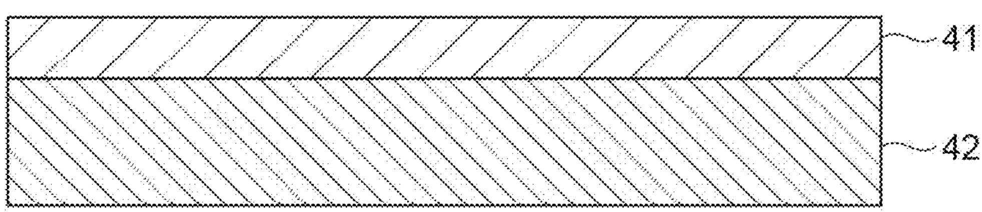

Next, a thin film manufacturing method according to the fifth aspect of the present invention will be described with reference to FIG. 3. FIG. 3 is a sectional view illustrating a thin-film formed body having a thin film formed by the thin film forming method according to the fifth aspect of the present invention.

As illustrated in FIG. 3, the thin film manufacturing method according to the present invention includes a step of forming a metal-Si based thin film 41 by performing sputtering on a base 42 using the sputtering target described above to obtain a thin-film formed body 40.

In the above thin film manufacturing method, even when the output of an apparatus for performing sputtering is high, the sputtering target is unlikely to crack, and thus, in the case of manufacturing a thin film 41, productivity of the thin film 41 can be increased. In addition, since the sputtering target has a low amount of oxygen, it is possible to suppress the generation of particles caused by abnormal electrical discharge during sputtering.

The base 42 is not particularly limited as long as the base 42 is composed of a material that can support the thin film 41. Examples of the base 42 includes glass, silicon, and sapphire substrates.

The thin film 41 may have a thickness of, for example, 1 μm or less.

EXAMPLES

The present invention will be more specifically described below by way of Examples, but the present invention is not limited to these Examples. In Examples and Comparative Examples, an average grain size of crystal phase grains, an average particle size of metal-Si based particles, a density (relative density) of a sintered body, an average grain size of sintered grains constituting a sintered body, a flexural strength of a sintered body, an amount of oxygen, an amount of metal impurities, a relative density of an untamped density to a true density, and the presence or absence of a crystal phase in a crystal phase grain were determined as described below.

(1) Average Grain Size of Crystal Phase Grains

A powder obtained by a gas atomization method (gas-atomized powder) was embedded in a resin to prepare a sample, the sample was cut, and a section of the sample was polished. Subsequently, any three points of the section were observed with a scanning electron microscope (SEM) under the conditions below, and photographs were taken. Grain sizes of crystal phase grains were measured from the obtained powder microstructure images (SEM images) by a diameter measurement method, and a 50% grain size of the crystal phase grains was calculated from the measured grain sizes as an average grain size. The measurement of the grains sizes was conducted for all (300 or more) of the crystal phase grains in the images. Herein, the diameter measurement method refers to a method in which when the entirety of one crystal phase grain is arranged so as to be fitted inside a circle, and the circle has a minimum diameter, the diameter is defined as a grain size of the crystal phase grain. In this case, the circle has the minimum diameter when the crystal phase grain is in contact with the circumference of the circle at at least two points.

(Conditions for Observation by Scanning Electron Microscope)

Acceleration voltage: 10 kV

Magnification for measurement: 1,500 times (2) Average Particle Size of Metal-Si Based Particles The average particle size of metal-Si based particles was calculated as follows. Specifically, metal-Si based particles were first passed through a multistage sieve (25, 32, 53, 75, 90, 106, 150, and 250 μm), and powders remaining on the sieves were collected, and the particle size distribution of the powders was measured. Subsequently, a particle size at D50 was calculated as the average particle size of the metal-Si based particles on the basis of the particle size distribution of the metal-Si based particles.

(3) Density (Relative Density) of Sintered Body

The relative density d of a sintered body was measured in accordance with JIS R 1634. Specifically, a bulk density was measured by the Archimedes method, and the relative density of the sintered body was calculated on the basis of the following expression.

$$\text{Relative density of sintered body} = 100 \times \text{bulk density} / \text{true density}$$

The true density d1 of the sintered body was calculated by an arithmetic mean represented by the following expression using a weight a [g] of a crystal phase A, a weight b [g] of a crystal phase B, a true density Ma [g/cm$^3$] of the crystal phase A, and a true density Mb [g/cm$^3$] of the crystal phase B.

$$d1=(a+b)/((a/Ma)+(b/Mb))$$

(4) Average Grain Size of Sintered Grains Constituting Sintered Body

After one surface of a sintered body was mirror-polished, any three points of grains constituting the sintered body were observed with a scanning electron microscope under the conditions below, and photographs were taken. Grain sizes of the grains constituting the sintered body were measured from the obtained sintered body microstructure images by the diameter measurement method, and a 50% grain size of the grains was calculated from the measured grain sizes of the grains as an average grain size. The measurement of the grains sizes was conducted for all (300 or more) of the grains in the images.

(Conditions for Observation by Scanning Electron Microscope)

Acceleration voltage: 10 kV

Magnification for measurement: 1,500

(5) Flexural Strength of Sintered Body

The flexural strength of a sintered body was measured in accordance with JIS R 1601. Specifically, a specimen was prepared, and the specimen was subjected to a three-point bending test to measure the flexural strength. The measurement conditions were as follows.

(Measurement Conditions for Flexural Strength)

Length of support span: 30 mm

Specimen size: 3×4×40 mm

Head speed: 0.5 mm/min (6) Amount of Oxygen

For a powder and a sample prepared by grinding a surface of a sintered body after firing by 1 mm or more and subsequently cutting out from any portion of the sintered body, the amount of oxygen was analyzed by the measurement method and the apparatus below, and the analysis value was defined as the amount of oxygen (measured data).

Measurement method: Impulse furnace fusion-infrared absorption method

Apparatus: Oxygen/nitrogen analyzer (Model: TC436, manufactured by LECO Corporation)

(7) Amount of Metal Impurities

For a powder and a sample prepared by grinding a surface of a sintered body after firing by 1 mm or more and subsequently cutting out from any portion of the sintered body, the amount of metal impurities was analyzed by the measurement method below, and the analysis value was defined as the amount of metal impurities (measured data).

Measurement method: Glow-discharge mass spectrometry (GDMS)

(8) Relative Density of Untamped Density to True Density

The untamped density of a powder was measured by the method described in JISZ2504. Subsequently, the relative density (%) of the untamped density to the true density of the powder was calculated on the basis of the following expression.

Relative density (%) of untamped density to true density of powder=100×untamped density of powder/true density of powder The true density d2 of the powder was calculated by an arithmetic mean represented by the following expression using a weight a [g] of a crystal phase A, a weight b [g] of a crystal phase B, a true density Ma [g/cm$^3$] of the crystal phase A, and a true density Mb [g/cm$^3$] of the crystal phase B.

$$d2=(a+b)/((a/Ma)+(b/Mb))$$

(9) Presence or Absence of Crystal Phase in Crystal Phase Grain

A powder obtained by a gas atomization method (gas-atomized powder) was embedded in a resin to prepare a sample, the sample was cut, and a section of the sample was polished. Subsequently, the section was tilted by 70° in a scanning electron microscope, a crystal phase grain in the section was irradiated with an electron beam to obtain a diffraction pattern from the crystal phase grain, and the presence or absence of a crystal phase in the crystal phase grain was checked on the basis of an image of the diffraction pattern. When a diffraction pattern was observed, the crystal phase grain was determined to include a crystal phase.

Example 1

A powder was produced by a gas atomization method as described below.

Specifically, first, Cr flakes (4N) and Si flakes (5N) were mixed in a carbon crucible to prepare a mixture. At this time, the content of the Cr flakes (4N) and the content of the Si flakes (5N) in the mixture were adjusted to 42% by weight and 58% by weight, respectively. Subsequently, the Cr flakes and the Si flakes were melted at a melting temperature of 1,650° C. in the carbon crucible to form a melt, the melt was dropped, and a gas was ejected to the melt at a gas pressure of 7 MPa. Thus, a powder was obtained. Subsequently, the obtained powder was passed through a sieve (sieve mesh size: 300 μm) in a glove box (oxygen concentration: 0.1% by weight or less) to perform particle-size adjustment of the powder.

Next, this powder was placed in a recessed portion (17 mm×45 mm×7 mm) of a carbon mold and fired by a hot-press method under the following firing conditions.

(Firing Conditions)

Firing furnace: Hot-press furnace

Temperature increase rate: 200° C./hour

Temperature increase atmosphere: Vacuum reduced-pressure atmosphere

Firing temperature: 1,200° C.

Pressure: 20 MPa

Firing time: 3 hours

Figure 4:
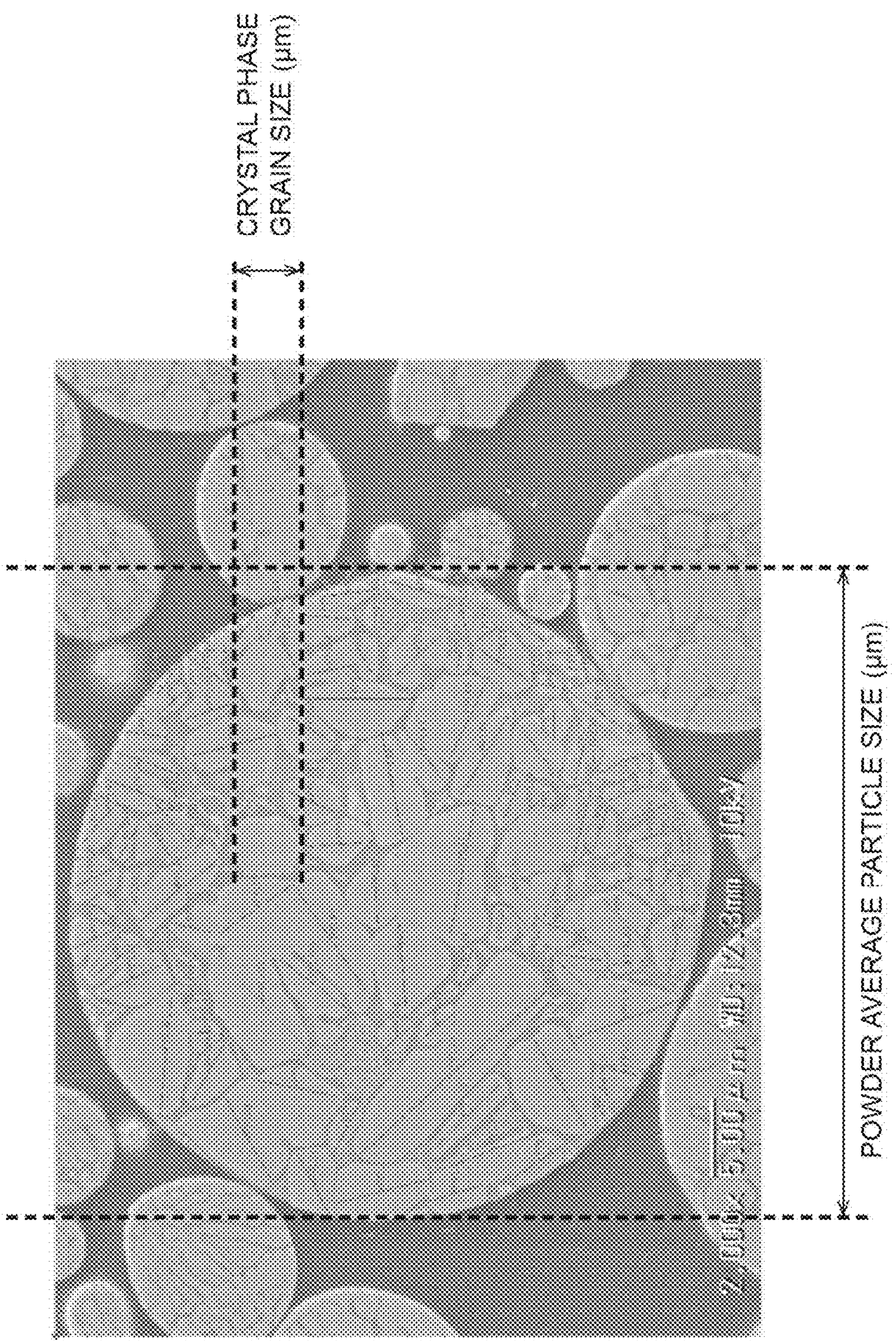
FIG. 4 is a view showing a SEM image of a section of a powder obtained in Example 1.

Thus, a microcrack-free sintered body having a size of 17 mm×45 mm×7 mmt was obtained. Characteristics of the powder and the sintered body are shown in Tables 1 and 2, respectively. A sectional view of the powder obtained by the gas atomization method is shown in FIG. 4. FIG. 4 shows a powder microstructure image (SEM image) obtained by observing, with a scanning electron microscope (SEM), a polished section prepared by embedding the gas-atomized powder in a resin to prepare a sample, cutting the sample, and polishing a section of the sample. The gas-atomized powder is a powder in a state after the particle-size adjustment thereof. The density of the sintered body was calculated using a true density calculated on the assumption that the content of the crystal phase A composed of $CrSi_2$ (true density: 4.98 [g/cm$^3$]) was 87% by weight, and the content of the crystal phase B composed of Si (true density: 2.3 [g/cm$^3$]) was 13% by weight.

Example 2

A powder was produced by a gas atomization method as described below.

Specifically, first, Cr flakes (4N) and Si flakes (5N) were mixed in a carbon crucible to prepare a mixture. At this time, the content of the Cr flakes (4N) and the content of the Si flakes (5N) in the mixture were adjusted to 18% by weight and 82% by weight, respectively. Subsequently, the Cr flakes and the Si flakes were melted at a melting temperature of 1,610° C. in the carbon crucible to form a melt, the melt was dropped, and a gas was ejected to the melt at a gas pressure of 7 MPa. Thus, a powder was produced by a gas atomization method. Subsequently, the obtained powder was passed through a sieve (sieve mesh size: 300 μm) in a glove box (oxygen concentration: 0.1% by weight or less) to perform particle-size adjustment of the powder.

Next, this powder was placed in a recessed portion (17 mm×45 mm×7 mm) of a carbon mold and fired by a hot-press method under the following firing conditions.

(Firing Conditions)

Firing furnace: Hot-press furnace

Temperature increase rate: 200° C./hour

Temperature increase atmosphere: Vacuum reduced-pressure atmosphere

Firing temperature: 1,275° C.

Pressure: 30 MPa

Firing time: 3 hours

Thus, a microcrack-free sintered body having a size of 17 mm×45 mm×7 mmt was obtained. Characteristics of the powder and the sintered body are shown in Tables 1 and 2, respectively. The density of the sintered body was calculated using a true density calculated on the assumption that the content of the crystal phase A composed of $CrSi_2$ (true density: 4.98 [g/cm$^3$]) was 37% by weight, and the content of the crystal phase B composed of Si (true density: 2.3 [g/cm$^3$]) was 63% by weight.

Examples 3 and 4

A powder and a sintered body were produced as in Example 2 except that the gas pressure serving as a gas atomization condition was changed as shown in Table 1. Characteristics of the powder and the sintered body are shown in Tables 1 and 2, respectively.

Example 5

A powder was produced by a gas atomization method as described below.

Specifically, first, Cr flakes (4N) and Si flakes (5N) were mixed in a carbon crucible to prepare a mixture. At this time, the content of the Cr flakes (4N) and the content of the Si flakes (5N) in the mixture were adjusted to 29% by weight and 71% by weight, respectively. Subsequently, the Cr flakes and the Si flakes were melted at a melting temperature of 1,600° C. in the carbon crucible to form a melt, the melt was dropped, and a gas was ejected to the melt at a gas pressure of 7 MPa. Thus, a powder was produced by a gas atomization method. Subsequently, the obtained powder was passed through a sieve (sieve mesh size: 300 μm) in a glove box (oxygen concentration: 0.1% by weight or less) to perform particle-size adjustment of the powder.

Next, this powder was placed in a recessed portion (17 mm×45 mm×7 mm) of a carbon mold and fired by a hot-press method.

(Firing Conditions)

Firing furnace: Hot-press furnace

Temperature increase rate: 200° C./hour

Temperature increase atmosphere: Vacuum reduced-pressure atmosphere

Firing temperature: 1,250° C.

Pressure: 20 MPa

Firing time: 3 hours

Thus, a microcrack-free sintered body having a size of 17 mm×45 mm×7 mmt was obtained. Characteristics of the powder and the sintered body are shown in Tables 1 and 2, respectively. The density of the sintered body was calculated using a true density calculated on the assumption that the content of the crystal phase A composed of $CrSi_2$ (true density: 4.98 [g/cm$^3$]) was 51% by weight, and the content of the crystal phase B composed of Si (true density: 2.3 [g/cm$^3$]) was 49% by weight.

Example 6

A powder was produced by a gas atomization method as described below.

Specifically, first, Cr flakes (4N) and Si flakes (5N) were mixed in a carbon crucible to prepare a mixture. At this time, the content of the Cr flakes (4N) and the content of the Si flakes (5N) in the mixture were adjusted to 48% by weight and 52% by weight, respectively. Subsequently, the Cr flakes (4N) and the Si flakes (5N) were melted at a melting temperature of 1,690° C. in the carbon crucible to form a melt, the melt was dropped, and a gas was ejected to the melt at a gas pressure of 7 MPa. Thus, a powder was produced by a gas atomization method. Subsequently, the obtained powder was passed through a sieve (sieve mesh size: 300 μm) in a glove box (oxygen concentration: 0.1% by weight or less) to perform particle-size adjustment of the powder.

Next, this powder was placed in a recessed portion (17 mm×45 mm×7 mm) of a carbon mold and fired by a hot-press method.

(Firing Conditions)

Firing furnace: Hot-press furnace

Temperature increase rate: 200° C./hour

Temperature increase atmosphere: Vacuum reduced-pressure atmosphere

Firing temperature: 1,300° C.

Pressure: 20 MPa

Firing time: 3 hours

Thus, a microcrack-free sintered body having a size of 17 mm×45 mm×7 mmt was obtained. Characteristics of the powder and the sintered body are shown in Tables 1 and 2, respectively. The density of the sintered body was calculated on the assumption that the content of the crystal phase A composed of $CrSi_2$ (true density: 4.98 [g/cm$^3$]) was 100% by weight.

Example 7

A powder was produced by a gas atomization method as described below.

Specifically, first, Cr flakes (4N) and Si flakes (5N) were mixed in a carbon crucible to prepare a mixture. At this time, the content of the Cr flakes (4N) and the content of the Si flakes (5N) in the mixture were adjusted to 80% by weight and 20% by weight, respectively. Subsequently, the Cr flakes (4N) and the Si flakes (5N) were melted at a melting temperature of 1,950° C. in the carbon crucible to form a melt, the melt was dropped, and a gas was ejected to the melt at a gas pressure of 7 MPa. Thus, a powder was produced by a gas atomization method. Subsequently, the obtained powder was passed through a sieve (sieve mesh size: 300 μm) in a glove box (oxygen concentration: 0.1% by weight or less) to perform particle-size adjustment of the powder.

Next, this powder was placed in a recessed portion (17 mm×45 mm×7 mm) of a carbon mold and fired by a hot-press method.

(Firing Conditions)

Firing furnace: Hot-press furnace

Temperature increase rate: 200° C./hour

Temperature increase atmosphere: Vacuum reduced-pressure atmosphere

Firing temperature: 1,600° C.

Pressure: 40 MPa

Firing time: 3 hours

Thus, a microcrack-free sintered body having a size of 17 mm×45 mm×7 mmt was obtained. Characteristics of the powder and the sintered body are shown in Tables 1 and 2, respectively. The density of the sintered body was calculated using a true density calculated on the assumption that the content of the crystal phase A composed of $Cr_3Si$ (true density: 6.46 [g/cm$^3$]) was 48% by weight, and the content of the crystal phase B composed of $Cr_5Si_3$ (true density: 5.87 [g/cm$^3$]) was 52% by weight.

Example 8

The powder obtained in Example 1 was passed through a sieve (sieve mesh size: 150 μm) in a glove box (oxygen concentration: 0.1% by weight or less) to perform particle-size adjustment of the powder, and a powder remaining on the sieve with a mesh size of 150 μm was used.

Next, this powder was fired by a hot-press method as in Example 1.

Thus, a microcrack-free sintered body having a size of 17 mm×45 mm×7 mmt was obtained. Characteristics of the powder and the sintered body are shown in Tables 1 and 2, respectively. The density of the sintered body was calculated using a true density calculated on the assumption that the content of the crystal phase A composed of $Cr_2Si$ (true density: 4.98 [g/cm$^3$]) was 87% by weight, and the content of the crystal phase B composed of Si (true density: 2.3 [g/cm$^3$]) was 13% by weight.

Example 9

The powder obtained in Example 1 was passed through a sieve (sieve mesh size: 32 μm) in a glove box (oxygen concentration: 0.1% by weight or less) to perform particle-size adjustment of the powder.

Next, this powder was fired by a hot-press method as in Example 1.

Thus, a microcrack-free sintered body having a size of 17 mm×45 mm×7 mmt was obtained. Characteristics of the powder and the sintered body are shown in Tables 1 and 2, respectively. The density of the sintered body was calculated using a true density calculated on the assumption that the content of the crystal phase A composed of $Cr_2Si$ (true density: 4.98 [g/cm$^3$]) was 87% by weight, and the content of the crystal phase B composed of Si (true density: 2.3 [g/cm$^3$]) was 13% by weight.

Example 10

The powder obtained in Example 1 was passed through a sieve (sieve mesh size: 106 μm) in a glove box (oxygen concentration: 0.1% by weight or less) to perform particle-size adjustment of the powder. Subsequently, the powder that had passed through the sieve (sieve mesh size: 106 μm) was further subjected to particle-size adjustment with a sieve (sieve mesh size: 90 μm), and a powder remaining on the sieve with a mesh size of 90 μm was used.

Next, this powder was fired by a hot-press method as in Example 1.

Thus, a microcrack-free sintered body having a size of 17 mm×45 mm×7 mmt was obtained. Characteristics of the powder and the sintered body are shown in Tables 1 and 2, respectively. The density of the sintered body was calculated using a true density calculated on the assumption that the content of the crystal phase A composed of $Cr_2Si$ (true density: 4.98 [g/cm$^3$]) was 87% by weight, and the content of the crystal phase B composed of Si (true density: 2.3 [g/cm$^3$]) was 13% by weight.

Comparative Example 1

First, 18% by weight of a Cr powder (4N) and 82% by weight of a Si powder (5N) were mixed and calcined at 1,250° C. to prepare a calcined body, followed by pulverization. Subsequently, the pulverized calcined body was placed in a can made of Fe, vacuum degassing was performed, and the can was then welded. Firing was performed by a HIP (hot isostatic press) method under the firing conditions below to obtain a sintered body.

(Firing Conditions)

Temperature increase rate: 200° C./hour

Temperature increase atmosphere: Ar

Firing temperature: 1,250° C.

Pressure: 100 MPa

Firing time: 1 hour

Characteristics of the sintered body obtained as described above are shown in Tables 1 and 2. The density of the sintered body was calculated using a true density calculated on the assumption that the content of the crystal phase A composed of $CrSi_2$ (true density: 4.98 [g/cm$^3$]) was 37% by weight, and the content of the crystal phase B composed of Si (true density: 2.3 [g/cm$^3$]) was 63% by weight.

Comparative Example 2

First, 42% by weight of a Cr powder (4N) and 58% by weight of a Si powder (5N) were mixed, and the mixed powder was calcined at 1,250° C. to prepare a calcined body, followed by pulverization. Subsequently, the pulverized calcined body was fired by a hot-press method under the firing conditions below to obtain a sintered body.

(Firing Conditions)

Firing furnace: Hot-press furnace

Temperature increase rate: 200° C./hour

Temperature increase atmosphere: Vacuum reduced-pressure atmosphere

Firing temperature: 1,200° C.

Pressure: 20 MPa

Firing time: 3 hours

Figure 5:
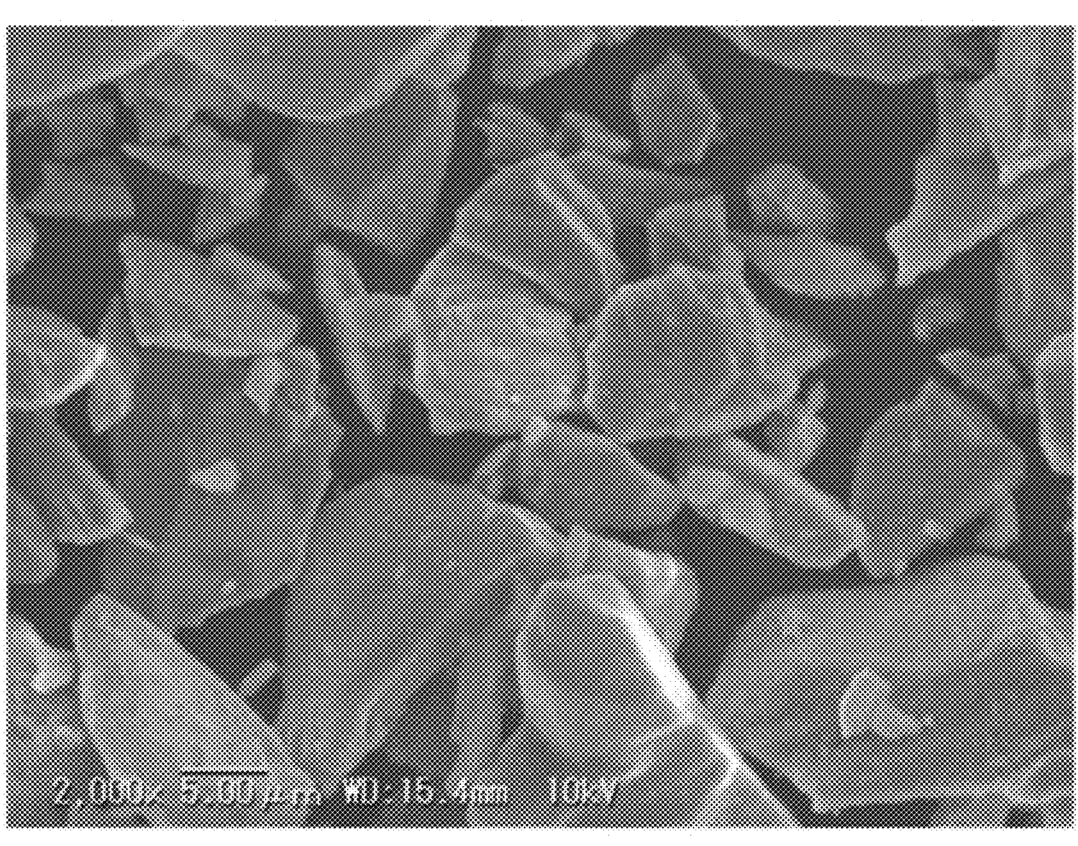
FIG. 5 is a view showing a SEM image of a powder obtained in Comparative Example 2.

Characteristics of the sintered body obtained as described above are shown in Tables 1 and 2. The obtained powder is shown in FIG. 5. FIG. 5 shows a powder image (SEM image) obtained by observation with a scanning electron microscope (SEM), and the powder is a powder at a stage after pulverization of the calcined body. The density of the sintered body was calculated using a true density calculated on the assumption that the content of the crystal phase A composed of crystal phase A: $CrSi_2$ (true density: 4.98

[g/cm$^3$]) was 87% by weight, and the content of the crystal phase B composed of Si (true density: 2.3 [g/cm$^3$]) was 13% by weight.

Comparative Example 3

A fine $CrSi_2$ powder (average particle size: 5 μm) and a fine Si powder (average particle size: 9 μm) were mixed and fired by a hot-press method at the temperature and pressure for the holding time shown in Table 2 to obtain a sintered body. Characteristics of the sintered body obtained as described above are shown in Table 2. The density of the sintered body was calculated using a true density calculated on the assumption that the content of the crystal phase A composed of $CrSi_2$ (true density: 4.98 [g/cm$^3$]) was 87% by weight, and the content of the crystal phase B composed of Si (true density: 2.3 [g/cm$^3$]) was 13% by weight.

TABLE 1

| | Powder | | | | | | | | | | | | |
|---|---|---|---|---|---|---|---|---|---|---|---|---|---|
| | Cr (wt %) | Si (wt %) | Powder alloying method | Temperature (° C.) | Gas pressure (MPa) | Average grain size of crystal phase grains (μm) | Number of crystal phase grains (grains) | Type of crystal phase | Average particle size of metal-Si based powder (μm) | Untamped density (Relative density) (%) | Amount of oxygen (wt %) | Total amount of metal impurities (ppm) |
| Example 1 | 42 | 58 | Gas atomization method | 1650 | 7 | 4 | 122 | $CrSi_2$/Si | 31 | 59.8 | 0.02 | 240 |
| Example 2 | 18 | 82 | Gas atomization method | 1610 | 7 | 4 | 67 | $CrSi_2$/Si | 32 | 59.7 | 0.02 | 210 |
| Example 3 | 18 | 82 | Gas atomization method | 1610 | 1 | 8 | 38 | $CrSi_2$/Si | 67 | 60.5 | 0.02 | 170 |
| Example 4 | 18 | 82 | Gas atomization method | 1610 | 3 | 6 | 42 | $CrSi_2$/Si | 48 | 60.3 | 0.02 | 190 |
| Example 5 | 29 | 71 | Gas atomization method | 1600 | 7 | 2 | 275 | $CrSi_2$/Si | 35 | 58.6 | 0.02 | 190 |
| Example 6 | 48 | 52 | Gas atomization method | 1690 | 7 | 9 | 43 | $CrSi_2$ | 31 | 56.0 | 0.02 | 240 |
| Example 7 | 80 | 20 | Gas atomization method | 1950 | 7 | 8 | 55 | $Cr_3Si$/ $Cr_5Si_3$ | 36 | 59.9 | 0.02 | 850 |
| Example 8 | 42 | 58 | Gas atomization method | 1650 | 7 | 13 | 307 | $CrSi_2$/Si | 197 | 62.4 | 0.01 | 240 |
| Example 9 | 42 | 58 | Gas atomization method | 1650 | 7 | 2 | 59 | $CrSi_2$/Si | 18 | 57.1 | 0.03 | 240 |
| Example 10 | 42 | 58 | Gas atomization method | 1650 | 7 | 7 | 147 | $CrSi_2$/Si | 92 | 61.3 | 0.01 | 240 |
| Comparative Example 1 | 18 | 82 | Pulverization + Calcination | 1250 | — | — | 1 | $CrSi_2$/Si | — | 26.5 | 1.5 | 160 |
| Comparative Example 2 | 42 | 58 | Pulverization + Calcination | 1250 | — | — | 1 | $CrSi_2$/Si | — | 27.3 | 0.1 | 4400 |
| Comparative Example 3 | 42 | 58 | — | — | — | 6 | 1 | $CrSi_2$/Si | 6 | 24.4 | 0.64 | 1100 |

TABLE 2

| | Sintered body | | | | | | | |
|---|---|---|---|---|---|---|---|---|
| | Method for producing sintered body | Temperature (° C.) | Pressure (MPa) | Holding time (h) | Average grain size of sintered grains (μm) | Density (%) | Flexural strength (MPa) | Amount of oxygen (wt %) |
| Example 1 | Hot-press method | 1200 | 20 | 3 | 6 | 99.9 | 305 | 0.02 |
| Example 2 | Hot-press method | 1275 | 30 | 3 | 5 | 99.9 | 280 | 0.02 |
| Example 3 | Hot-press method | 1275 | 30 | 3 | 10 | 95.7 | 163 | 0.02 |
| Example 4 | Hot-press method | 1275 | 30 | 3 | 7 | 98.3 | 209 | 0.02 |
| Example 5 | Hot-press method | 1250 | 20 | 3 | 3 | 99.6 | 277 | 0.02 |
| Example 6 | Hot-press method | 1300 | 20 | 3 | 10 | 99.2 | 193 | 0.02 |
| Example 7 | Hot-press method | 1600 | 40 | 3 | 9 | 95.6 | 280 | 0.03 |
| Example 8 | Hot-press method | 1200 | 20 | 3 | 15 | 99.5 | 146 | 0.01 |
| Example 9 | Hot-press method | 1200 | 20 | 3 | 3 | 99.9 | 366 | 0.04 |
| Example 10 | Hot-press method | 1200 | 20 | 3 | 9 | 99.6 | 196 | 0.02 |
| Comparative Example 1 | HIP method | 1250 | 100 | 1 | 46 | 98.1 | 58 | 1.8 |
| Comparative Example 2 | Hot-press method | 1200 | 20 | 3 | 70 | 99.2 | 33 | 0.1 |
| Comparative Example 3 | Hot-press method | 1150 | 40 | 3 | 3 | 99.1 | 160 | 0.66 |

While the present invention has been described in detail with reference to the specific embodiments, it will be apparent to one skilled in the art that various changes and alterations can be made without departing from the spirit and scope of the present invention.

The present application is based on Japanese Patent Application (No. 2020-091321) filed on May 26, 2020, the entire contents of which are incorporated herein by reference. Furthermore, all the references cited herein are incorporated as a whole.

REFERENCE SIGNS LIST

10 metal-Si based powder
10A metal-Si based particle
11 crystal phase grain
12 substance
20 metal-Si based sintered body
21 sintered grain
40 thin-film formed body
41 thin film
42 base

The invention claimed is:

1. A metal-Si based powder, comprising:
a metal-Si based particle comprising a plurality of crystal phase grains,
wherein the crystal phase grains comprise a crystal phase comprising a compound of a metal and Si,
wherein the metal is Cr, and
wherein the powder comprises oxygen in an amount of 0.5% by weight or less,
wherein the powder has a relative density of an untamped density to a true density of at least 50%, and
wherein the percent relative density of the untamped density to the true density of the powder is calculated according to the following expression:
Percent relative density of untamped density to true density of powder=100×untamped density of powder/true density of powder.

2. The metal-Si based powder of claim 1, wherein the crystal phase grains have an average grain size of 20 μm or less.

3. The metal-Si based powder of claim 1, wherein the metal-Si based particle has an average particle size of from 5 μm to 100 μm.

4. The metal-Si based powder of claim 1,
wherein the metal-Si based particle further comprises a substance that fills a gap between the crystal phase grains, and
the substance has a crystal phase.

5. The metal-Si based powder of claim 4, wherein the metal-Si based particle comprises two types of crystal phases.

6. The metal-Si based powder of claim 5, wherein the two types of crystal phases include a first crystal phase comprising a silicide and a second crystal phase comprising Si.

7. The metal-Si based powder of claim 6, wherein a content of the first crystal phase is higher than a content of the second crystal phase.

8. The metal-Si based powder of claim 1, wherein a total amount of metal impurities in the metal-Si based particle is 300 mass ppm or less.

9. The metal-Si based powder of claim 1, comprising 0.03% by weight or less of oxygen.

10. The metal-Si based powder of claim 1, wherein the number of the crystal phase grains in the metal-Si based particle is from 10 to 500.

11. The metal-Si based powder of claim 1, wherein the crystal phase grains have an average grain size of 10 μm or less.

12. The metal-Si based powder of claim 1, wherein the metal-Si based particle has an average particle size of from 10 μm to 70 μm.

13. The metal-Si based powder of claim 5, wherein a content of a first crystal phase in the metal-Si based particles is from 30% by weight to 95% by weight.

* * * * *